(12) United States Patent
Wada et al.

(10) Patent No.: US 6,754,122 B2
(45) Date of Patent: Jun. 22, 2004

(54) SEMICONDUCTOR MEMORY DEVICE HAVING OVERDRIVEN BIT-LINE SENSE AMPLIFIERS

(75) Inventors: Masaharu Wada, Yokohama (JP); Kenji Tsuchida, Kawasaki (JP); Tsuneo Inaba, Kamakura (JP); Toshimi Ikeda, Kawasaki (JP)

(73) Assignees: Kabushiki Kaisha Toshiba, Tokyo (JP); Fujitsu Limited, Kanagawa (JP)

( * ) Notice: Subject to any disclaimer, the term of this patent is extended or adjusted under 35 U.S.C. 154(b) by 0 days.

(21) Appl. No.: 10/358,389

(22) Filed: Feb. 5, 2003

(65) Prior Publication Data

US 2003/0174545 A1 Sep. 18, 2003

(30) Foreign Application Priority Data

Feb. 5, 2002 (JP) .................................... 2002-028559

(51) Int. Cl.⁷ ................................. G11C 7/02
(52) U.S. Cl. ...................................... 365/207; 365/204
(58) Field of Search ............................... 365/207, 204, 365/203, 189.09, 189.11

(56) References Cited

U.S. PATENT DOCUMENTS

| 6,115,316 A | * | 9/2000 | Mori et al. ............. 365/230.03 |
| 6,347,058 B1 | * | 2/2002 | Houghton et al. ........... 365/203 |
| 6,477,100 B2 | * | 11/2002 | Takemura et al. ........... 365/207 |
| 6,487,133 B2 | | 11/2002 | Wada et al. ................. 365/205 |

* cited by examiner

Primary Examiner—Anh Phung
(74) Attorney, Agent, or Firm—Banner & Witcoff, Ltd.

(57) ABSTRACT

After data readout, in equalizing a complementary pair of bit lines one of which has been overdriven with an overdrive voltage, excessive charges on the overdriven bit line are discharged by a discharge circuit. By adjusting the discharge period of the discharge circuit, the potential to which the bit lines are equalized is adjusted.

26 Claims, 10 Drawing Sheets

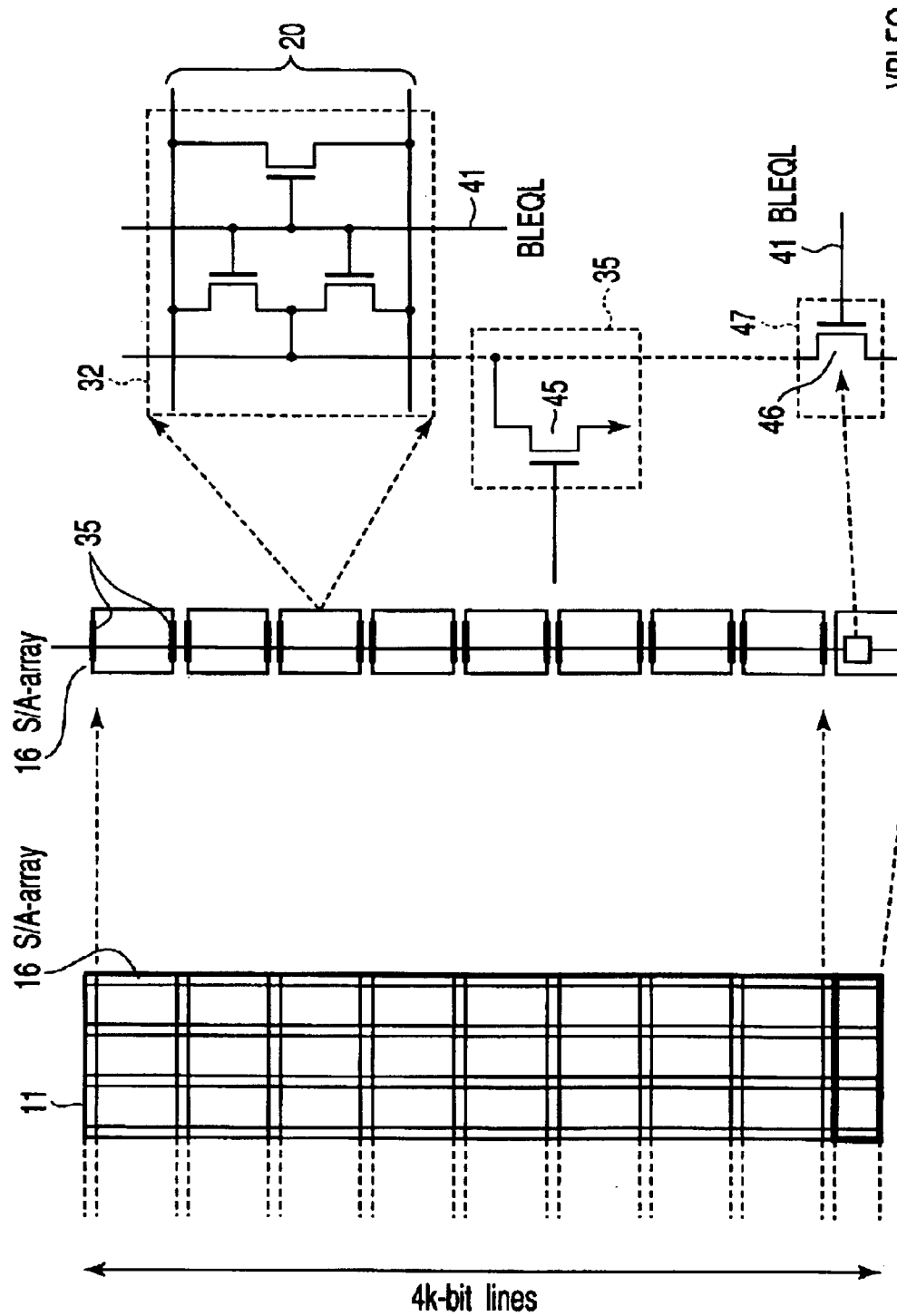

SEMICONDUCTOR MEMORY DEVICE HAVING OVERDRIVEN BIT-LINE SENSE AMPLIFIERS

CROSS-REFERENCE TO RELATED APPLICATIONS

This application is based upon and claims the benefit of priority from the prior Japanese Patent Application No. 2002-028559, filed Feb. 5, 2002, the entire contents of which are incorporated herein by reference.

BACKGROUND OF THE INVENTION

1. Field of the Invention

The present invention relates to a semiconductor memory device and more particularly to correction of a potential to which bit lines are equalized when a overdriving method is used in the memory core section to improve the reading speed of bit line sense amplifiers. For example, the present invention is applied to memory integrated circuit, logic-merged semiconductor memories, etc.

2. Description of the Related Art

With dynamic random access memories (DRAMs), readout, amplification and restoration of small-signal data from memory cells are performed by bit-line sense amplifiers. Japanese Unexamined Patent Publication 2002-25264 discloses a DRAM which, in order to improve the reading speed of bit line sense amplifiers, adopts an overdrive system to drive the sense amplifiers with a voltage (overdriving voltage) higher than a restore potential at the beginning of cell data amplification, thereby effecting high-speed data amplification.

With the DRAM disclosed in the above publication, an overdrive potential higher than the restore potential is applied to a P-type sense amplifier at the initial stage of cell data readout, thereby performing the overdriving operation. Overdriving results in the timing of sensing the bit line potential being advanced. After that, overdriving is stopped and a restore potential is applied to the bit line charged up to the overdriving potential, so that the bit line potential is stabilized at the restore potential. Subsequently, the bit line pair is precharged to a precharge potential and then equalized.

With increasing speed of DRAMs, shortening the active period to increase the reading speed results in the period for stabilizing the bit line at the restore potential being shortened. As a result, the bit line potential after the potential on the bit line charged to a high potential by overdriving and the potential on the bit line charged to a low potential have been equalized is affected by an increase in potential resulting from the overdriving operation. For this reason, the bit line potential after equalization will be higher than an intermediate value between the restore potentials of the paired bit lines.

The potential on a bit line of the equalized bit line pair is used as reference potential in reading cell data in the next cycle. For this reason, reading cell data in the state where the potential on the equalized bit line pair has been increased as a result of an increase in potential resulting from overdriving results in the reduced margin for reading "1" data. It therefore becomes difficult to read cell data correctly. Therefore, the demand has increased for solving this problem.

BRIEF SUMMARY OF THE INVENTION

According to the present invention, there is provided a semiconductor memory device comprises: a plurality of memory cells; a plurality of bit line pairs connected to the memory cells; a plurality of bit line sense amplifiers each of which is connected to a corresponding one of the bit line pairs to amplify the potential difference across the corresponding bit line pair; an overdrive potential generating circuit which generates an overdrive potential; a first sense amplifier driver connected between each of the bit line sense amplifiers and the overdrive potential generating circuit to output the overdrive potential to the bit line amplifiers; a second sense amplifier driver connected between each of the bit line amplifiers and a predetermined potential to output the predetermined potential to the bit line amplifiers; a plurality of bit line precharge/equalization circuits each of which is connected to a corresponding one of the bit line pairs and a precharge potential line to precharge each of the bit line pairs with the precharge potential and equalize the potentials on each of the bit line pairs; and at least one discharge circuit coupled to the bit line pairs to discharge the potentials on the bit line pairs to a discharge potential.

BRIEF DESCRIPTION OF THE SEVERAL VIEWS OF DRAWING

FIG. 15A shows the pattern layout of a portion of a subarray of the DRAM according to the fourth embodiment;

FIG. 15B shows the enlarged pattern layout of a portion of the subarray of FIG. 15A; and FIG. 15C shows the circuit arrangement of a portion of FIG. 15B.

DETAILED DESCRIPTION OF THE INVENTION

Figure 1:
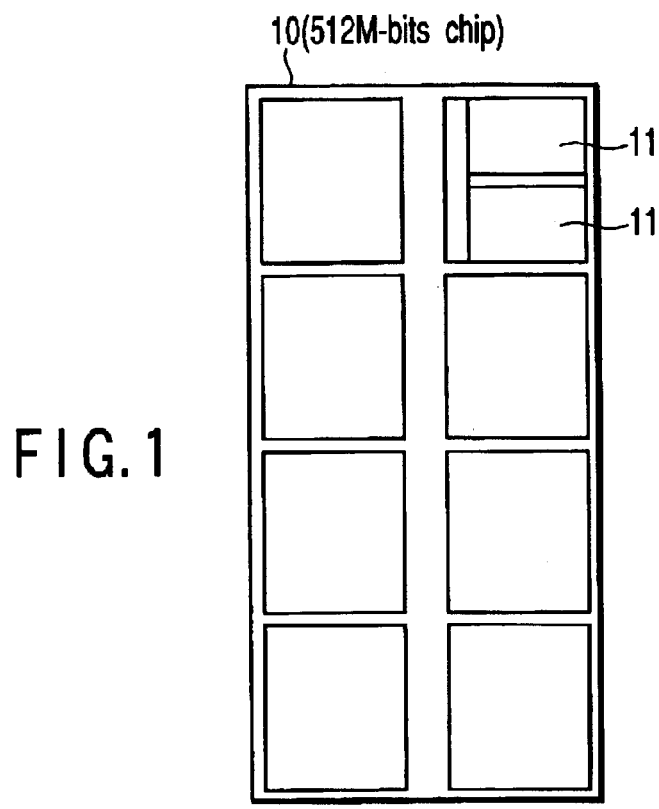
FIG. 1 shows the pattern layout of the whole of a DRAM chip according to a first embodiment of the present invention.

The embodiments of the present invention will be described hereinafter with reference to the accompanying drawings. Corresponding parts are denoted by like reference characters throughout all the views and repeated description thereof is omitted.

[First Embodiment]

FIG. 1 shows the pattern layout of the whole of a DRAM chip 10 which has a storage capacity of 512 Mbits and adopts an overdriving scheme.

The chip 10 contains 16 arrays 11 each having a storage capacity of 32 Mbits.

Figure 2A:
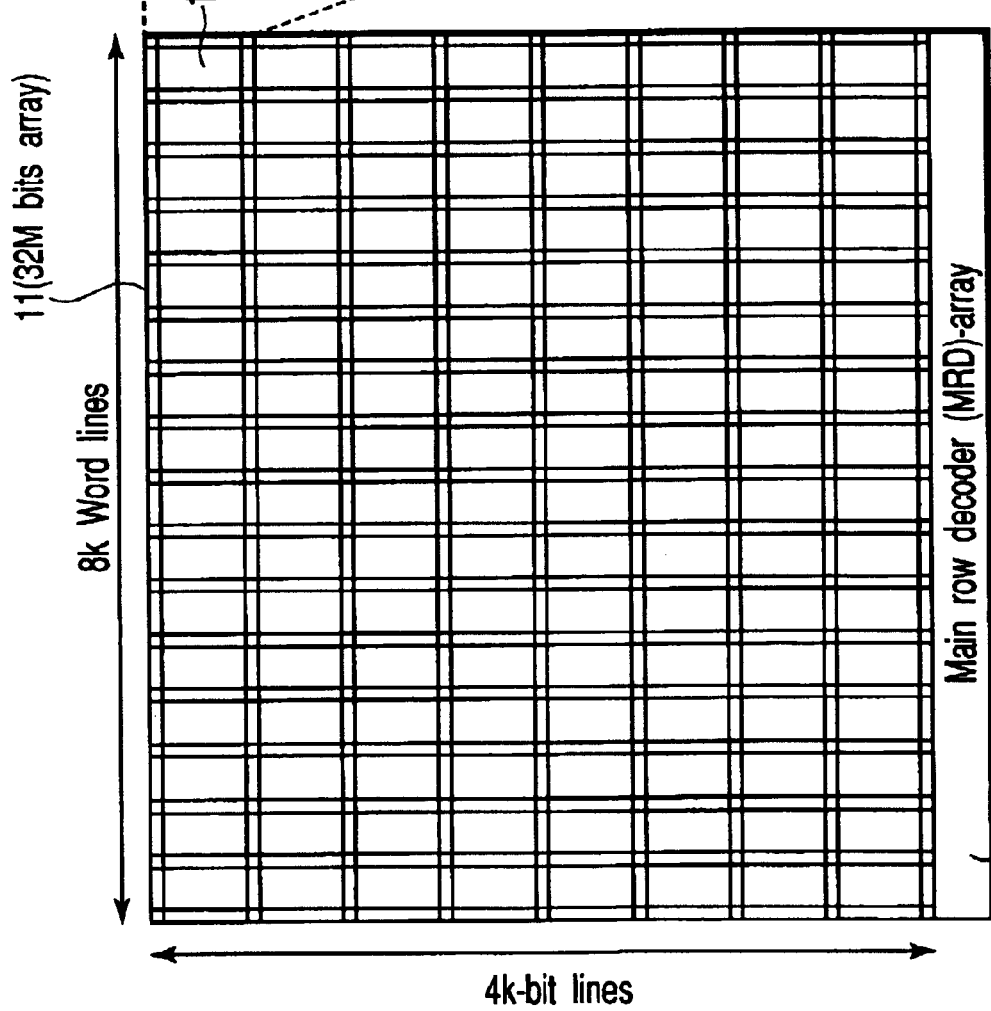
FIG. 2A shows the enlarged pattern layout of a portion of the DRAM of FIG. 1.

FIG. 2A shows one of the 32-Mbit arrays 11 in enlarged form. In each of the arrays 11, 128 subarrays 12 each having a storage capacity of 256 Kbits are arranged in the form of a matrix of 16 rows×8 columns. At one end of the 16×8 matrix in the direction of column is placed a main row decoder (MRD) array 13. The 32-Mbit array 11 has 8K word lines and 4K bit lines.

Figure 2B:
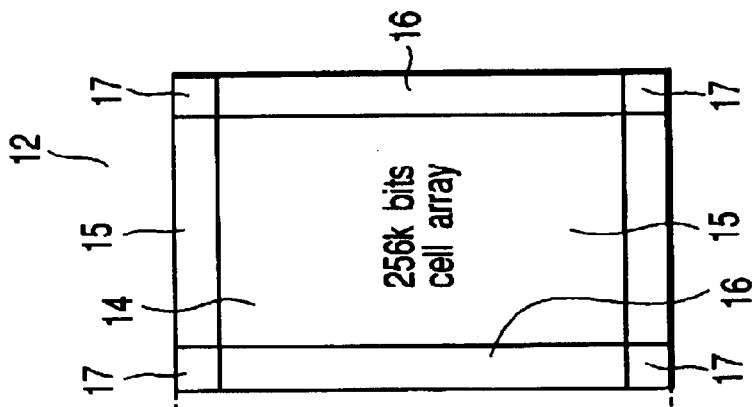
FIG. 2B shows the pattern layout of a subarray and its associated peripheral circuits of the DRAM of FIG. 2A.

FIG. 2B shows the enlarged pattern layout of one subarray 12 and its associated peripheral circuits of the 32 Mbit array 11 shown in FIG. 2A.

In the subarray 12, segment row decoder arrays 15, each of which has segment row decoders arranged as an array, are placed at both ends in the direction of column of a 256-Kbit cell array 14. Bit line sense amplifier arrays 16, each of which has bit line sense amplifiers arranged as an array, are placed at both ends in the direction of row of the 256-Kbit cell array 14. Reference numeral 17 denotes intersect regions where the segment row decoder arrays 15 and the bit line sense amplifier arrays 16 intersect. In each of the four intersect regions 17, control circuits are placed which control the bit line sense amplifiers and the segment row decoders.

Figure 3:
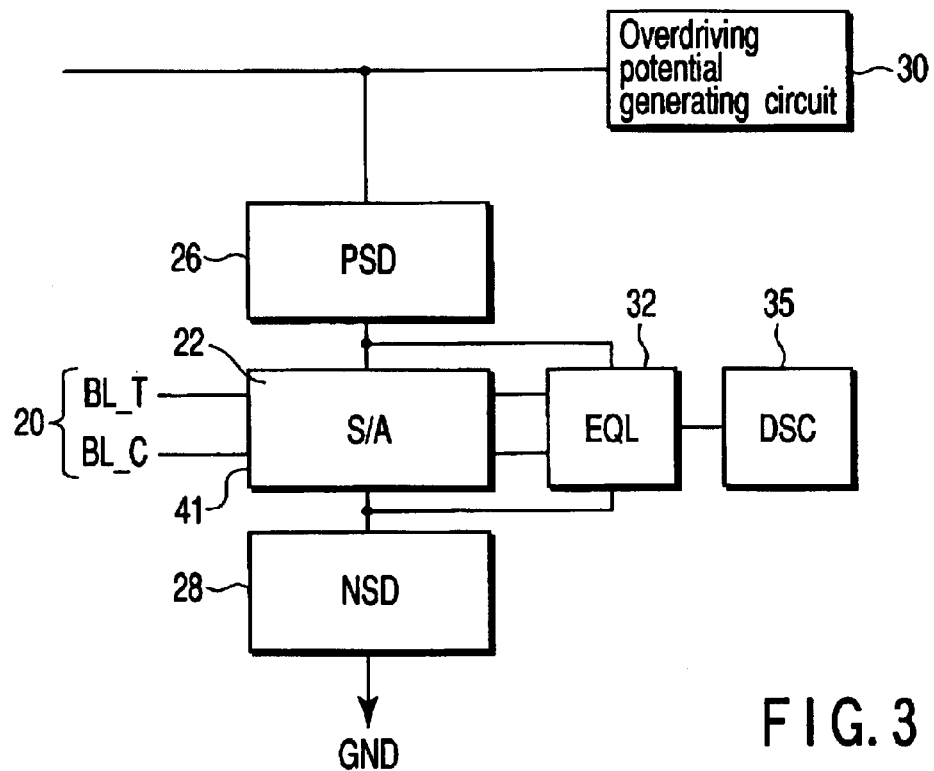
FIG. 3 is a block diagram of a portion of the subarray of FIG. 2B.
Figure 4:
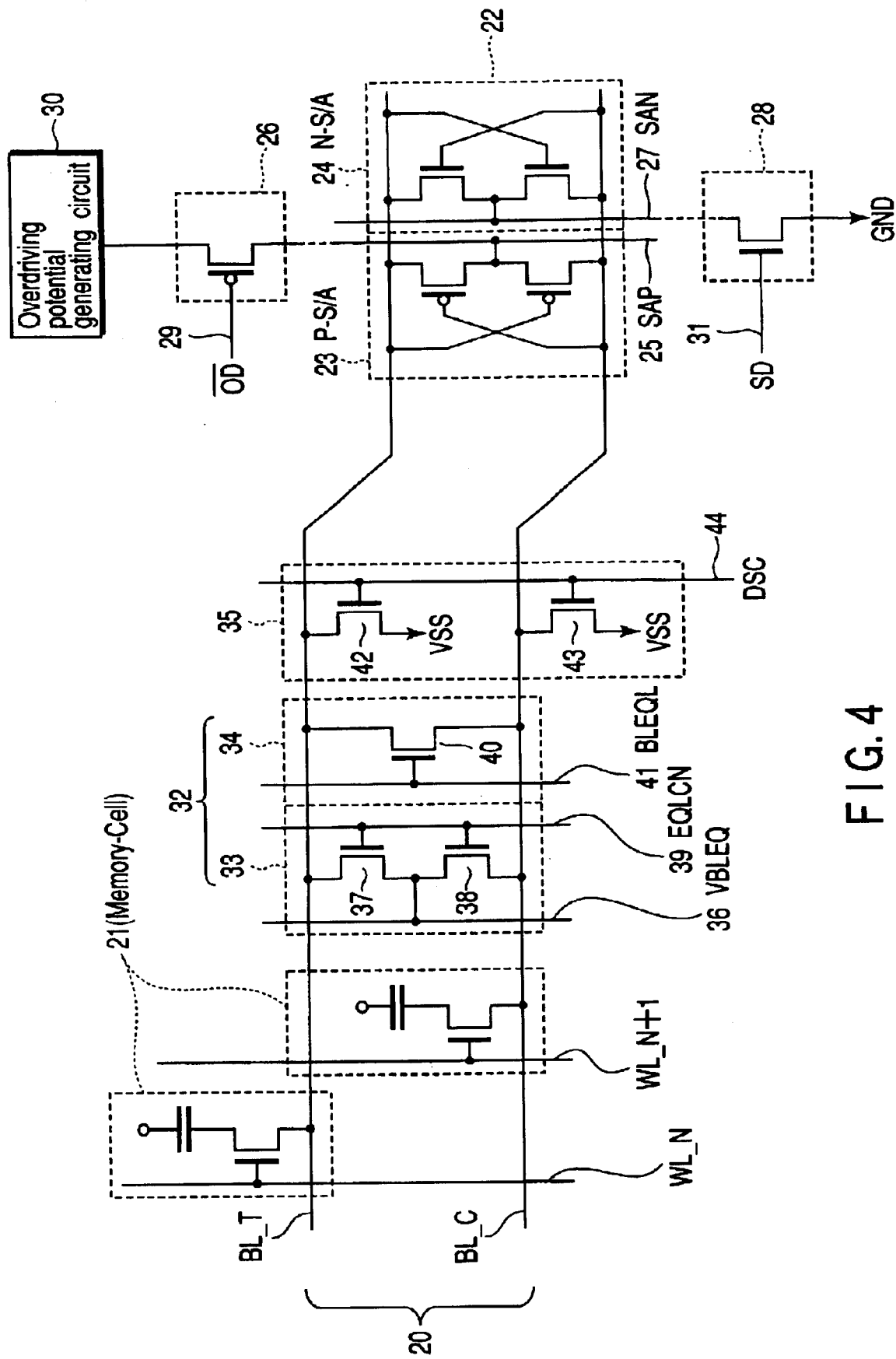
FIG. 4 shows circuit arrangements of the circuits and the cell array shown in FIG. 3.

FIG. 3 illustrates, in block diagram form, a portion of the bit line sense amplifier arrays 16 in FIG. 2B. FIG. 4 shows the circuit arrangements of the portion shown in FIG. 3 and the corresponding portion of the cell array.

In FIGS. 3 and 4, a bit line pair 20 consists of a bit line BL_T that is used in positive logic with external I/O and a bit line BL_C that is used in negative logic with external I/O. Although a number of bit line pairs is provided in the subarray 12, only one bit line pair 20 is shown in FIG. 4. A number of memory cells 21 is connected with each of the bit lines BL_T and BL_C forming the bit line pair 20. In FIG. 4, only one memory cell 21 is connected with each of the bit lines BL_T and BL_C for the purpose of simplifying illustration. A word line is connected to each of the memory cells 21. In FIG. 4, a word line WL_N is connected to the memory cell 21 connected to the bit line BL_T and a word line WL_N+1 is connected to the memory cell 21 connected to the bit line BL_C.

To the bit line pair 20 is connected a bit line sense amplifier (S/A) 22, which is composed of a P-type sense amplifier (P—S/A) 23 and an N-type sense amplifier (N—S/A) 24. The P-type sense amplifier 23, composed of two PMOSFETs, is connected by a P-type sense amplifier driving line (SAP) 25 to a P-type sense amplifier driver (PSD) 26. The P-type sense amplifier 23 is supplied with positive charges via the P-type sense amplifier driver 26. The N-type sense amplifier 24, composed of two NMOSFETs, is connected by an N-type sense amplifier driving line (SAN) 27 to an N-type sense amplifier driver (NSD) 28. The N-type sense amplifier 24 is supplied with negative charges via the N-type sense amplifier driver 28.

The P-type sense amplifier driver 26 has an overdriving PMOSFET having its gate electrode connected to an overdrive control signal line 29 to receive an overdrive control signal /OD. The current path between the source and the drain of the overdriving PMOSFET is connected between the output node of an overdriving potential generating circuit 30 and the P-type sense amplifier driving line 25. The overdriving potential generating circuit 30 generates an overdriving potential higher than a restore voltage of the bit line pair 20.

The N-type sense amplifier driver 28 has a sensing NMOSFET having its gate electrode connected to a sense drive control signal line 31 to receive a sense drive control signal SD. The current path between the source and the drain of the sensing NMOSFET is connected between an N-type sense amplifier driving line 27 and a ground line. The ground line is connected to ground potential GND.

In the sense amplifier region within the chip, not only the bit line sense amplifier 22 but also a bit line precharge/equalization circuit (EQL) 32 adapted to precharge and equalize the bit line pair 20 is placed. The bit line precharge/equalization circuit 32 includes a precharge circuit 33 and an equalization circuit 34. Further, in this embodiment, a discharge circuit (DSC) 35 adapted to discharge the bit line pair 20 is added to the sense amplifier region.

The precharge circuit 33 includes an NMOSFET 37 having its current path connected between the bit line BL_T and a bit line precharge potential line 36 for providing a bit line precharge potential VBLEQ and an NMOSFET 38 having its current path connected between the bit line BL_C and the bit line precharge potential line 36. The NMOSFETs 37 and 38 have their gate electrodes connected together to a precharge control signal line 39 which provides a bit line precharge control signal EQLCN.

The equalization circuit 34 is composed of an NMOSFET 40 having its current path connected between the bit lines BL_T and BL_C. The NMOSFET 40 has its gate electrode connected to an equalization control signal line 41 which provides a bit line equalization control signal BLEQL.

The precharge circuit 33 is controlled by the bit line precharge control signal EQLCN supplied over the precharge control signal line 39. The equalization circuit 34 is controlled by the bit line equalization control signal BLEQL supplied over the equalization control signal line 41.

The discharge circuit 35, which is placed in the vicinity of the precharge/equalization circuit 32, is composed of two NMOSFETs 42 and 43 each of which has its current path connected between a respective one of the bit lines BL_T and BL_C and a discharge potential lower than the restore potential of the bit lines, e.g., ground potential GND. The discharge operation is controlled by a discharge control signal DCS applied to the gate electrodes of the respective NMOSFETs 42 and 43 over a discharge control signal line 44.

Figure 5:
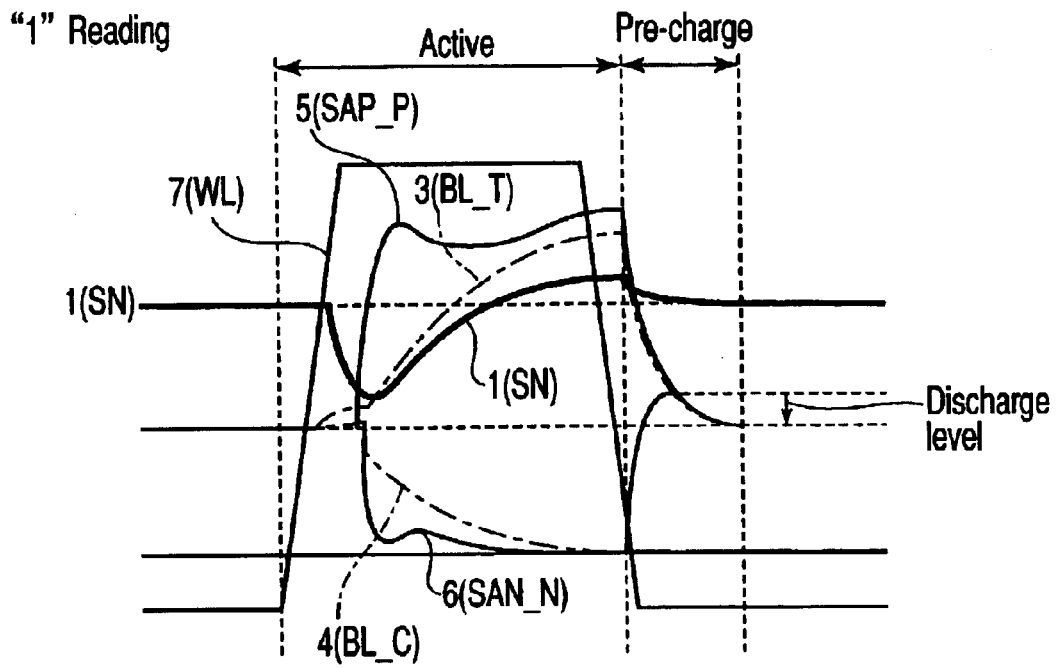
FIG. 5 is a waveform diagram illustrating an example of an operation of the circuit shown in FIG. 4.
Figure 6:
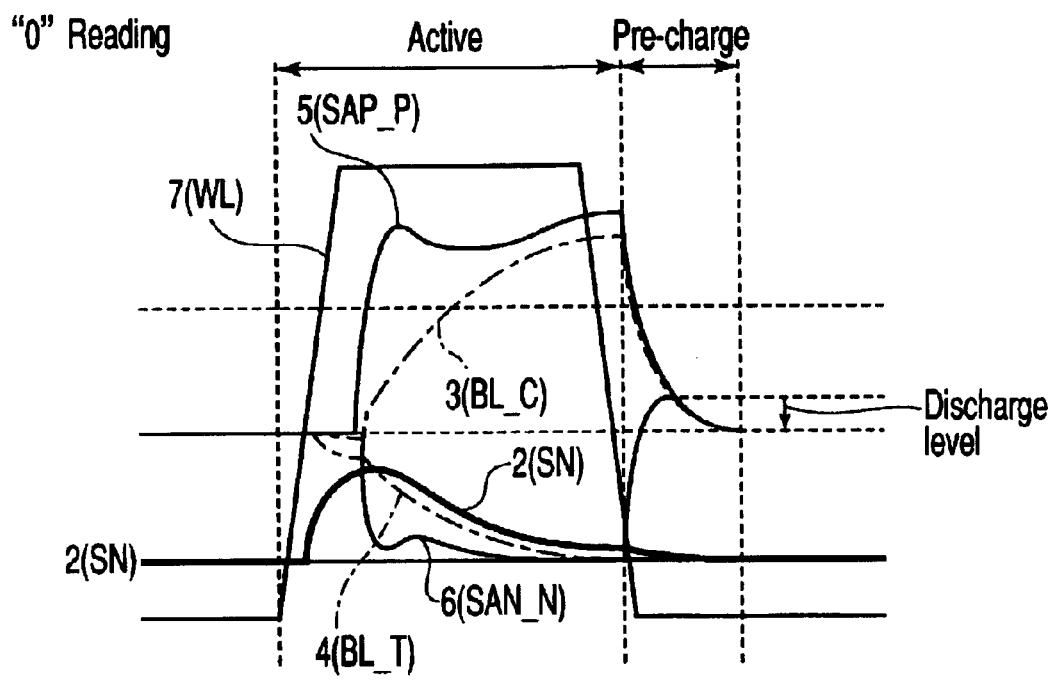
FIG. 6 is a waveform diagram illustrating another example of an operation of the circuit shown in FIG. 4.
Figure 7:
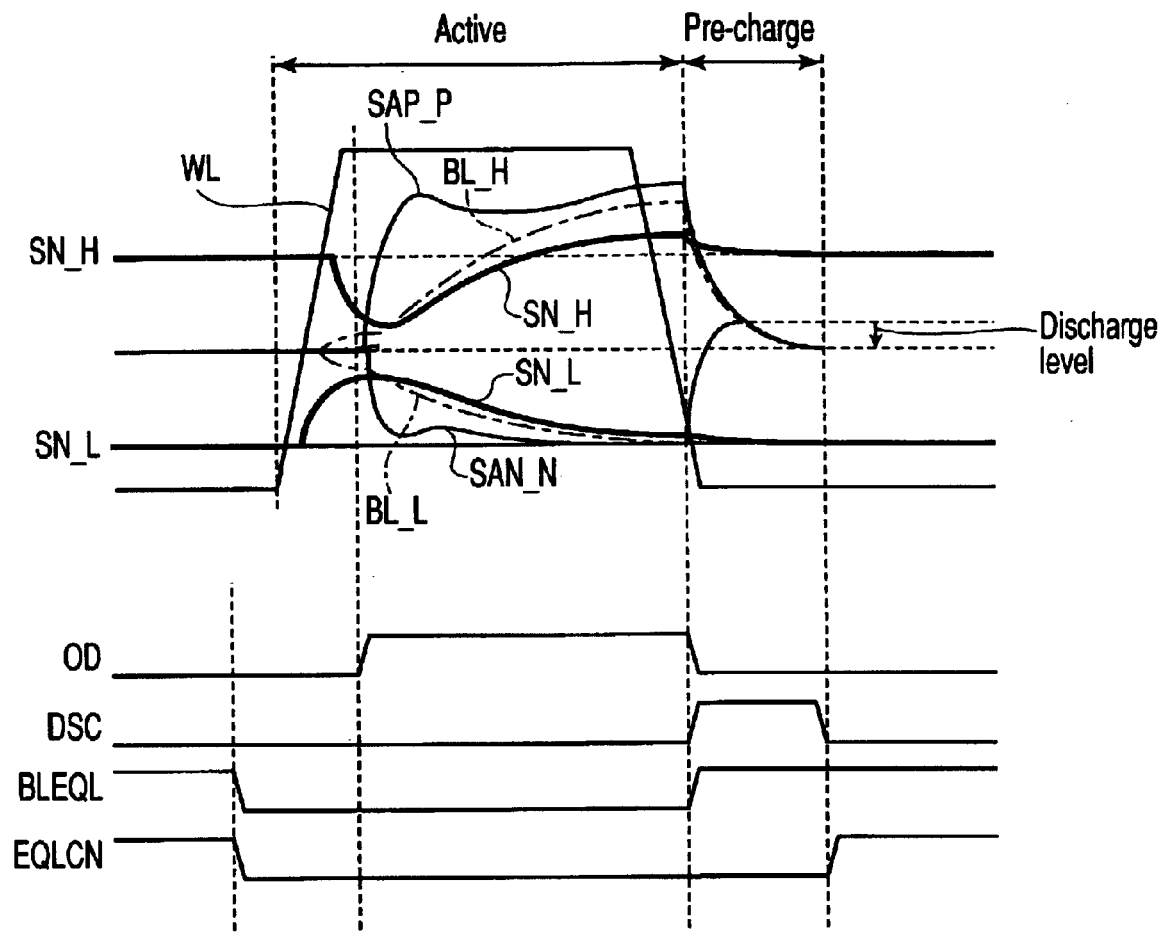
FIG. 7 is a waveform diagram in which the operations of FIGS. 5 and 6 are taken together.

FIG. 5 is a waveform diagram explanatory of a read operation of the DRAM arranged as shown in FIG. 4 to read "1" data from a memory cell. Likewise, FIG. 6 is a waveform diagram explanatory of a read operation of the DRAM to read "0" data from a memory cell. FIG. 7 shows a timing relationship between the operating waveforms shown in FIGS. 5 and 6 and various control signals.

In FIG. 7, the overdrive control signal OD, the discharge control signal DSC, the bit line equalization control signal BLEQL and the bit line precharge control signal EQLCN are all represented in positive logic.

In FIGS. 5 and 6, a waveform 1 indicates the potential on the storage node (SN_H) of a cell is capacitor written with "1" data, a waveform 2 indicates the potential on the storage node (SN_L) of a cell capacitor written with "0" data, a waveform 3 indicates the potential on the bit line (BL_T) to read "1" data, a waveform 4 indicates the potential on the bit line (BL_C) to read "0" data, a waveform 5 indicates the potential on the output node SAP—P of the P-type sense amplifier driver 26, a waveform 6 indicates the potential on the output node SAN—N of the N-type sense amplifier driver 28, and a waveform 7 indicates the potential on the word line WL.

As shown in FIG. 7, when the active period begins, the potential on the word line WL is raised to select a memory cell, so that data is read from the storage node of the cell capacitor onto the bit line. After that, the overdrive control signal OD is activated. During an interval when the control signal OD is activated, a signal at a low level is applied to the gate electrode of the overdriving PMOSFET in the p-type sense amplifier driver 26, so that the PMOSFET conducts. As a result, the overdrive potential (higher than the restore potential) generated by the overdrive potential generating circuit 30 is output onto the P-type sense amplifier driving line 25, thus driving the P-type sense amplifier 23. During the interval when the control signal OD is activated, the sense drive signal SD at a high level is applied to the gate electrode of the sensing NMOSFET in the N-type sense amplifier driver 28, so that the NMOSFET also conducts. Thereby, the ground potential is output onto the N-type sense amplifier driving line 27, thus driving the N-type sense amplifier 24. Namely, the P-type sense amplifier driver 26 and the N-type sense amplifier driver 28 start to output the overdrive potential and ground potential at substantially the same time. On termination of the active period, the P-type sense amplifier driver 26 and the N-type sense amplifier driver 28 stop outputting the overdrive potential and ground potential at substantially the same time.

During the precharge period subsequent to the active period, the discharge control signal DSC and the bit line equalization control signal BLEQL are activated. On termination of the precharge period, the discharge control signal DSC is deactivated, while the bit line precharge control signal EQLCN is activated.

That is, in FIG. 7, the bit line equalization control signal BLEQL and the bit line precharge control signal EQLCN become deactivated before the potential on the word line WL rises. Cell data is transferred to the bit line after the potential on the word line WL has risen. After that, the P-type sense amplifier 23 is driven by the overdrive potential higher than the restore voltage and the N-type sense amplifier 24 is driven by ground potential, thereby amplifying the potential difference across the bit line pair 20. At this point, since the P-type sense amplifier 23 is driven by the overdrive potential higher than the restore voltage, the potential on the bit line onto which "1" data has been read out from the storage node rises up to a sufficiently high potential. At this point, "1" data is restored to the storage node of the memory cell from which "1" data has been read. The read data is output to the outside of the memory through an I/O circuit not shown. The overdrive operation is terminated at the time when the potential on the storage node to which "1" data is restored has been fully charged. Subsequently, the bit line pair 20 is subjected to an equalize operation and a discharge operation.

The overdrive operation causes the potential BL_H on that bit line of the bit line pair onto which "1" data has been read out to go to a rather high potential. Thus, the bit line pair including the bit line caused to go to the high potential is discharged. That is, during the precharge period, the discharge control signal DSC goes to the high level, causing the two NMOSFETs 42 and 43 in the discharge circuit 35 to turn ON to thereby discharge the bit line pair 20 to ground potential. In addition, the bit line equalization control signal BLEQL on the equalization control signal line 41 also goes to the high level during the precharge period, causing the NMOSFET 40 in the equalization circuit 34 to conduct. Thereby, the bit lines BL_T and BL_C are short-circuited. That is, during the precharge period, the bit lines BL_T and BL C are rapidly discharged in the short-circuited state. The bit line reference potential after the bit lines have been discharged can be corrected so as to agree with the subsequent bit line precharge potential by adjusting the high level period of the discharge control signal DSC. In FIGS. 5, 6 and 7, this corrected potential difference is indicated as discharge level.

After that, the discharge control signal DSC is deactivated and the bit line precharge control signal EQLCN is activated. Thereby, the NMOSFETs 37 and 38 in the precharge circuit 33 are rendered conductive and the bit lines BL_T and BL_C are precharged to the bit line precharge potential VBLEQ. In this precharge operation, the bit lines BL_T and BL_C are stabilized quickly at the bit line reference potential because they have been maintained in advance at the reference potential.

In FIG. 7, the bit line equalization control signal BLEQL is maintained activated even after the discharge control signal DSC has been deactivated. This is illustrative and not restrictive. The bit line equalization control signal BLEQL may be deactivated at the same time the discharge control signal DSC is deactivated.

Figure 8:
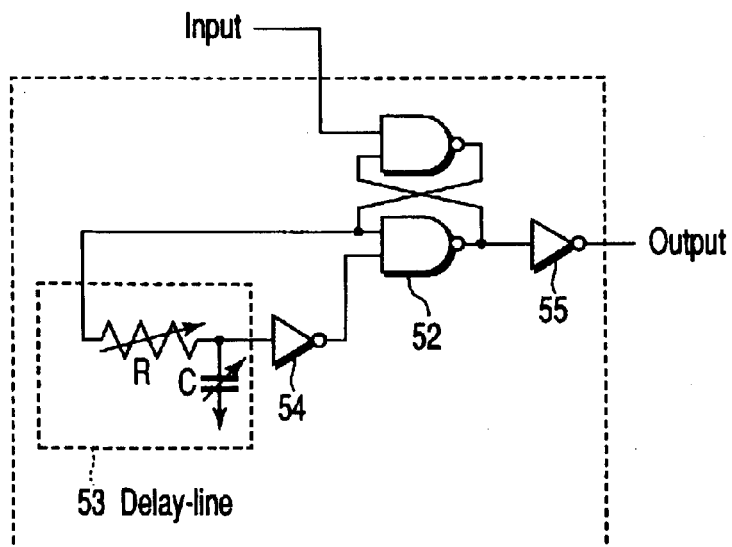
FIG. 8 shows a circuit arrangement of a timing generator for producing each of control signals shown in FIG. 7.

FIG. 8 shows a typical example of a number of timing generating circuits that generate the control signals shown in FIG. 7.

The timing generating circuit 51 of FIG. 8 includes a flip-flop circuit 52 composed of two NAND gates each with two inputs, a delay line 53 composed of a resistor R and a MOS capacitor C, and two inverters 54 and 55.

Figure 9:
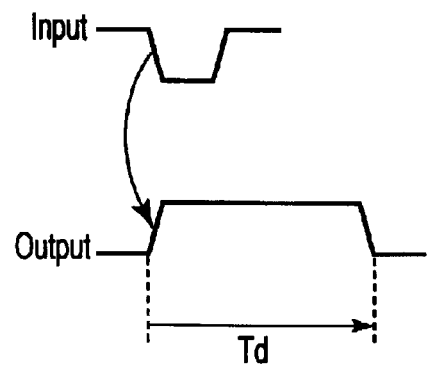
FIG. 9 shows the waveforms of input and output signals of the timing generator of FIG. 8.

FIG. 9 illustrates the operation of the timing generating circuit 51 of FIG. 8. When an input signal goes to a low level, an output signal goes to a high level and then maintains the high level for a time interval Td corresponding to a delay time introduced by the delay line 53.

In order to change the value of the resistor R and the value of the MOS capacitor C as required, the delay line 53 is configured so that its circuit arrangement can be changed using metal interconnections, switches composing of transistors, or fuses though not shown.

Changing the resistance value and the capacitance value allows proper timing to be established in terms of evaluation of actual devices. For example, by changing the times at which the overdrive control signal OD and the discharge control signal DSC fall to adjust their high level (activation) period, the bit line equalization potential can be adjusted to a desired value as shown in FIG. 7.

Figure 10:
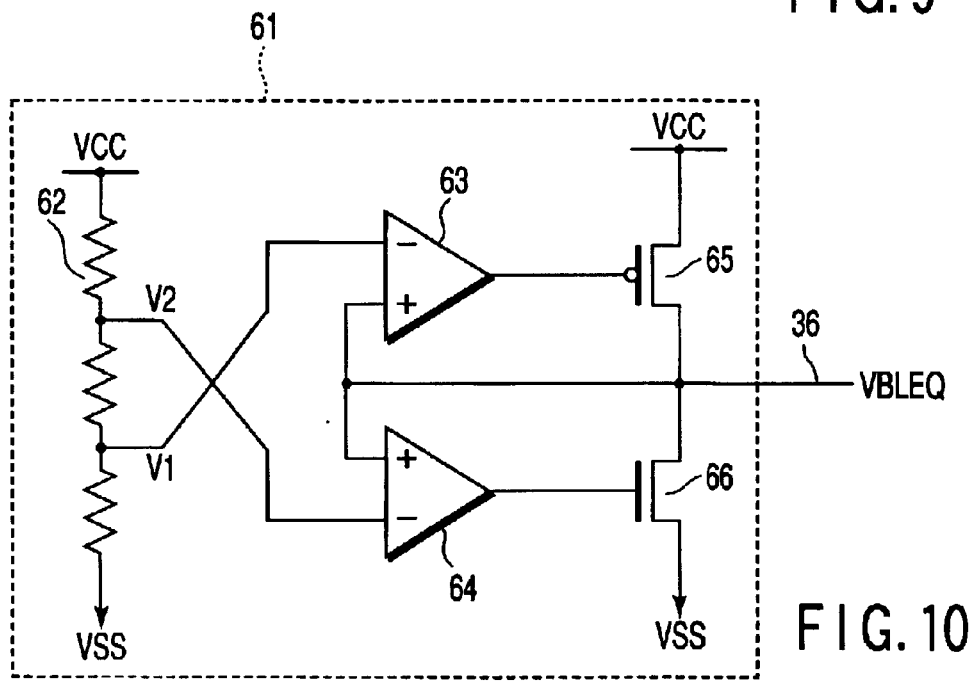
FIG. 10 shows a circuit arrangement of the bit line precharge potential generating circuit of FIG. 4.

The bit line precharge potential VBLEQ generated by a bit line precharge potential generating circuit to be described below with reference to FIG. 10 is adjusted so that the equalization potential is set to a desired value.

FIG. 10 shows an example of a bit line precharge potential generating circuit that generates the bit line precharge potential VBLEQ.

The bit line precharge potential generating circuit 61 includes a voltage divider 62, first and second voltage comparators (operational amplifiers) 63 and 64, a PMOSFET 65, and an NMOSFET 66. The voltage divider 62 comprises three resistors connected in series between supply voltage VCC and ground potential VSS to provide two reference voltages V1 and V2. The first voltage comparator 63 is connected at its noninverting terminal (+) to the potential VBLEQ on the bit line precharge potential line 36 and at its inverting terminal (−) to the reference voltage V1. The output of the first voltage comparator 63 is connected to the gate electrode of the PMOSFET 65 acting as a driver. The current path of the PMOSFET 65 is connected between the VCC node and the bit line precharge potential line 36.

The second voltage comparator 64 is connected at its noninverting terminal (+) to the potential VBLEQ on the bit line precharge potential line 36 and at its inverting terminal (−) to the reference voltage V2. The output of the second voltage comparator 64 is connected to the gate electrode of the NMOSFET 66 acting as a driver. The current path of the NMOSFET 66 is connected between the VSS node and the bit line precharge potential line 36.

The bit line precharge potential generating circuit 61 shown in FIG. 10 is configured so that the voltage division ratios of the voltage divider 62 can be changed using metal interconnections, switches composing of transistors, or fuses though not shown. Thus, the bit line precharge potential VBLEQ can be set to a desired value by changing the voltage division ratios as required.

With the DRAM according to the first embodiment, the potential on the bit line onto which data at logic 1 is read out is raised to a sufficiently high potential by driving the bit line sense amplifier 22, particularly the P-type sense amplifier 23, with an overdrive potential, allowing the timing of sensing of data to be advanced. Moreover, after data has been sensed, the bit line pair is equalized by the equalization circuit 34 while it is discharged by the discharge circuit 35, allowing the potential on the bit line pair 20 to be adjusted so as to agree with the bit line reference potential. Thus, cell data can be read correctly even if the duration of a read operation is made short.

Even if there is a difference in readout margin between read "1" data and "0" data, the timing of discharging of the bit line pair 20 or the bit line precharge potential can be adjusted to adjust the bit line reference potential in the next read operation cycle. Thus, the readout margin can be increased.

[Second Embodiment]

Figure 11:
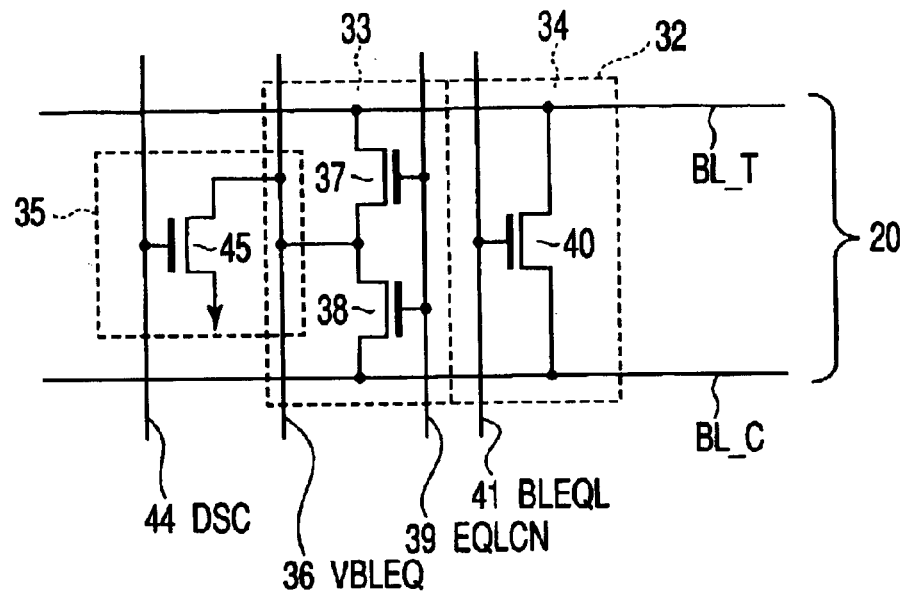
FIG. 11 shows the circuit arrangement of a portion of a subarray of a DRAM according to a second embodiment of the present invention.

FIG. 11 shows the circuit arrangement of a portion of a DRAM according to a second embodiment of the present invention.

In FIG. 11, the discharge circuit 35 comprises an NMOSFET 45 having its current path connected between the bit line precharge potential line 36 and discharge potential (GND). The discharge control signal line 44 is connected to the gate electrode of the NMOSFET 45.

In the second embodiment, as in the first embodiment, the discharge circuit 35 is provided for each bit line pair. Unlike the first embodiment, however, the discharge circuit 35 is formed of a single NMOSFET that is connected between the bit line precharge potential line 36 and ground potential.

The timing of each control signal used in the circuit of FIG. 11 is basically the same as in the first embodiment. In the case of FIG. 11, however, since the NMOSFET 45 is connected to the bit line precharge potential line 36, the timing of the bit line precharge control signal EQLCN is changed so that the bit line precharge circuit 33 will operate while the discharge circuit 35 is operating.

According to such a configuration, the bit line pair 20 is discharged by the discharge circuit 35 through the bit line precharge potential line 36 early in the precharge period.

Thus, since the equalization potential for the bit line pair 20 can be corrected by discharging the bit line pair, the second embodiment provides the same advantages as the first embodiment.

Moreover, the second embodiment provides an advantage that the number of discharging MOSFETs is allowed to be half of that in the first embodiment.

[Third Embodiment]

Figure 12:
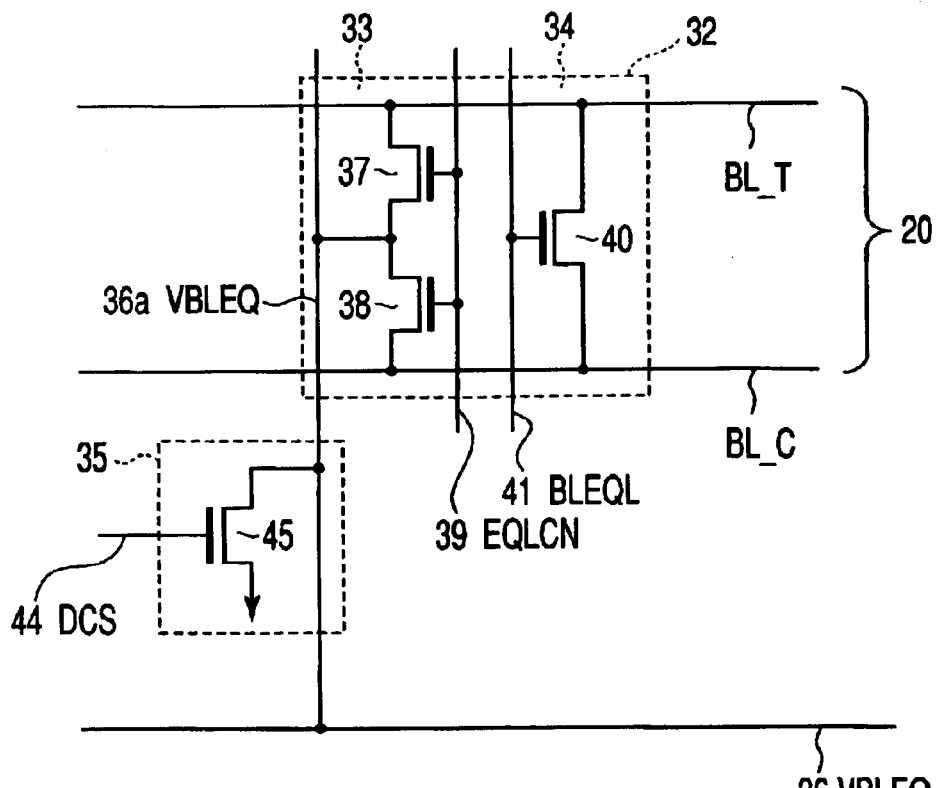
FIG. 12 shows the circuit arrangement of a portion of a subarray of a DRAM according to a third embodiment of the present invention.

FIG. 12 shows the circuit arrangement of a portion of a DRAM according to a third embodiment of the present invention.

The first and second embodiments have been described as providing a discharge circuit for each bit line pair. In the third embodiment, a discharge circuit is provided for every two or more bit line pairs. As in the second embodiment, each discharge circuit is comprised of a single NMOSFET.

Figure 13:
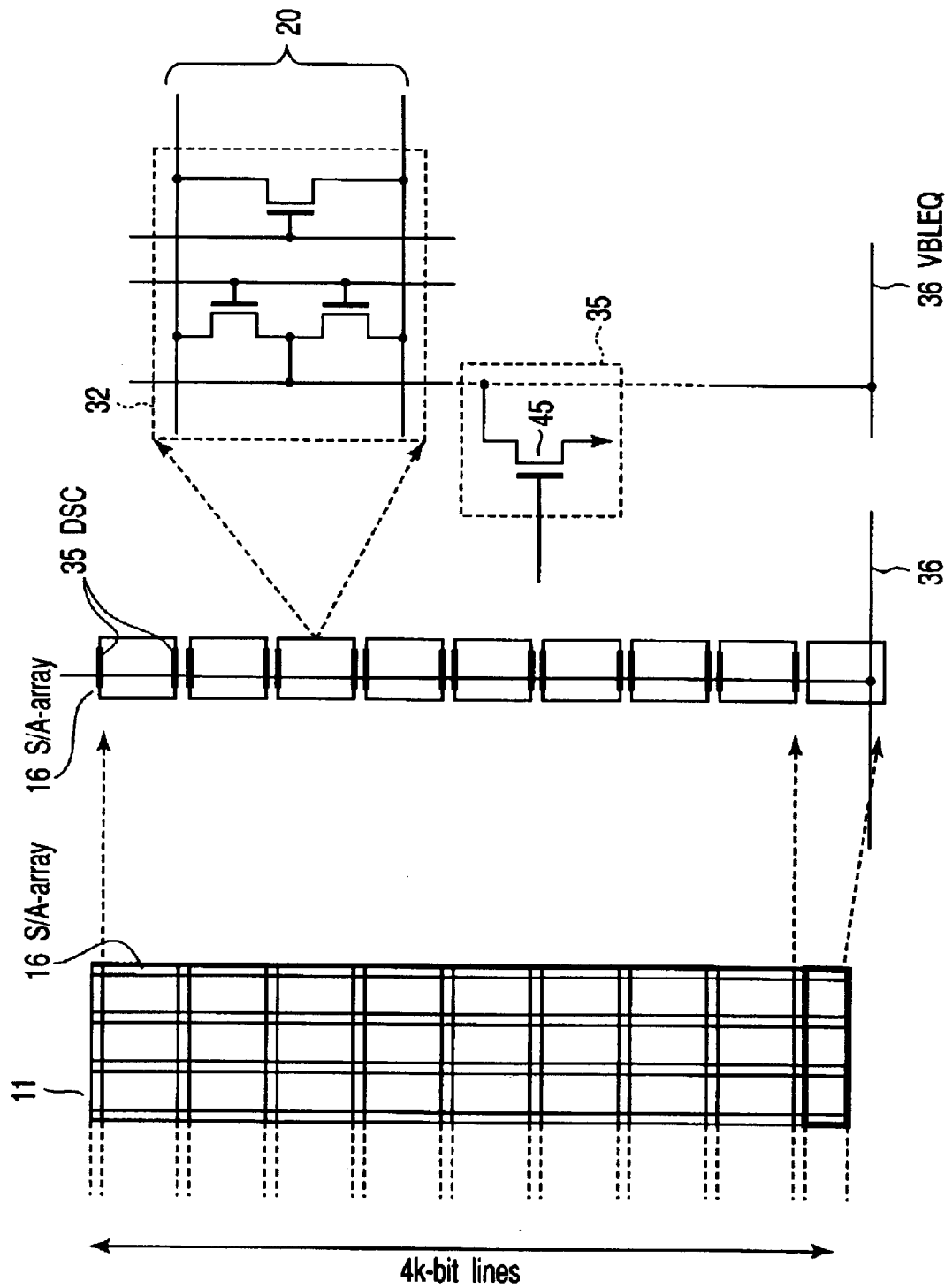
FIG. 13A shows the pattern layout of a portion of a subarray of the DRAM according to the third embodiment.
FIG. 13B shows the enlarged pattern layout of a portion of the subarray of FIG. 13A.
FIG. 13C shows the circuit arrangement of a portion of FIG. 13B.

FIGS. 13A, 13B and 13C show the distributed arrangement of discharge circuits 35 shown in FIG. 12 within the sense amplifier array. More specifically, FIG. 13A is an enlarged view of a portion of the 32-Mbit array 11 shown in FIG. 1. FIG. 13B is an enlarged view of a portion of the bit line sense amplifier array 16 in FIG. 13A. FIG. 13C shows, in enlarged form, a bit line sense amplifier 32 and a discharge circuit 35 in the array 16 of FIG. 13B.

The third embodiment basically operates identically to the second embodiment and hence provides the same advantages as the second embodiment. In addition, the number of the discharging NMOSFETs 45 can be reduced significantly in comparison with the second embodiment, allowing the layout area to be reduced.

[Fourth Embodiment]

Figure 14:
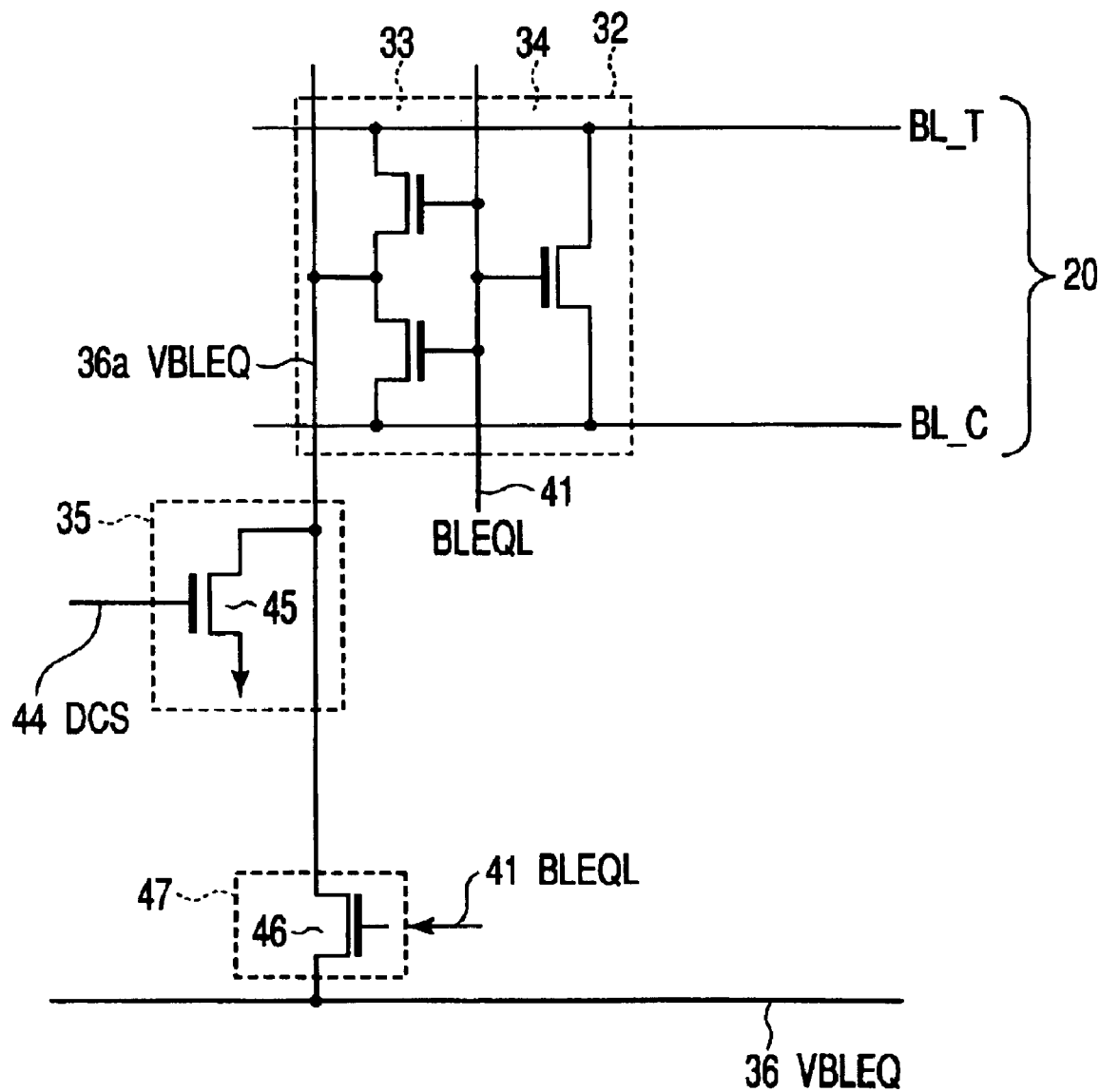
FIG. 14 shows the circuit arrangement of a portion of a subarray of a DRAM according to a fourth embodiment of the present invention.

FIG. 14 shows the circuit arrangement of a portion of a DRAM according to a fourth embodiment of the present invention.

In the fourth embodiment, as in the third embodiment, the discharge circuit 35 is provided for every two or more bit line pairs. Unlike the third embodiment, a switch circuit 47 comprised of an NMOSFET 46 is arranged in the middle of a bit line precharge potential line 35a branched off from the bit line precharge potential line 36. The NMOSFET 46 has its gate electrode connected to receive the bit line equalization control signal BLEQL.

The circuit arrangement shown in FIG. 14 differs from that of the third embodiment shown in FIG. 12 only in the following points (1) and (2):

(1) The switch circuit 47 is inserted at a point on the bit line precharge potential line 36a which is nearer to the bit line precharge potential line 36 than to the connection node of the discharge circuit 35. The switch circuit 47 is controlled by the bit line equalization control signal BLEQL so as to turn OFF while the discharge control signal DCS is activated.

(2) The bit line precharge control signal EQLCN is supplied over the same interconnection 41 as the bit line equalization control signal BLEQL. Namely, the precharge circuit 33 and the equalization circuit 34 are both controlled by the bit line equalization control signal BLEQL.

The circuit of FIG. 14 operates basically identically to the circuit described in conjunction with FIG. 12 but differs in that the precharge circuit 33 and the equalization circuit 34 are controlled simultaneously and the switch circuit 47 is turned OFF when the discharge circuit 35 is operating.

Thus, the bit line pair 20 is discharged by the discharge circuit 35 through the bit line precharge potential line 36a early in the bit line precharge/equalization operation by the bit line precharge/equalization circuit 32. Since the switch circuit 47 is kept OFF during the discharge operation, it becomes possible to prevent the discharge operation from affecting other circuits via the bit line precharge potential line 36.

FIGS. 15A, 15B and 15C show the distributed arrangement of discharge circuits 35 shown in FIG. 14 within the sense amplifier array. More specifically, FIG. 15A is an enlarged view of a portion of the 32-Mbit array 11 shown in FIG. 1. FIG. 15B is an enlarged view of a portion of the bit line sense amplifier array 16 in FIG. 15A. FIG. 15C shows, in enlarged form, a bit line sense amplifier 32, a discharge circuit 35 and a switch circuit 47 in the array 16 of FIG. 15B.

The fourth embodiment basically operates identically to the third embodiment and hence provides the same advantages as the third embodiment. In addition, it is possible to prevent the operation of the discharge circuit 35 from affecting other circuits via the bit line precharge potential line 36. Moreover, the bit line precharge control signal line for the precharge circuit 33 can be omitted, allowing the number of interconnection lines to be reduced by one.

Control of the precharge circuit 33 and the equalization circuit 34 at such times as described in the fourth embodiment would allow the bit line precharge control signal and the bit line equalization control signal to be supplied from separate interconnection lines with the interconnection lines in the first, second and third embodiments used as they are.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a plurality of memory cells;
a plurality of bit line pairs connected to the memory cells;
a plurality of bit line sense amplifiers each of which is connected to a corresponding one of the bit line pairs to amplify the potential difference across the corresponding bit line pair;
an overdrive potential generating circuit which generates an overdrive potential;
a first sense amplifier driver connected between each of the bit line sense amplifiers and the overdrive potential generating circuit to output the overdrive potential to the bit line amplifiers;
a second sense amplifier driver connected between each of the bit line amplifiers and a predetermined potential to output the predetermined potential to the bit line amplifiers;
a plurality of bit line precharge/equalization circuits each of which is connected to a corresponding one of the bit line pairs and a precharge potential line to precharge each of the bit line pairs with the precharge potential and equalize the potentials on each of the bit line pairs; and
at least one discharge circuit coupled to the bit line pairs to discharge the potentials on the bit line pairs to a discharge potential.

2. The semiconductor memory device according to claim 1, wherein the overdrive potential generating circuit generates a potential higher than a restore potential of the bit line pairs as the overdrive potential.

3. The semiconductor memory device according to claim 1, wherein the discharge potential is ground potential.

4. The semiconductor memory device according to claim 1, wherein the overdrive potential is higher than the precharge potential.

5. The semiconductor memory device according to claim 1, further comprising a precharge potential generating circuit which generates the precharge potential, and the precharge potential generating circuit has a function of adjusting the precharge potential.

6. The semiconductor memory device according to claim 1, wherein each of the bit line sense amplifiers includes a first sense amplifier section connected to the corresponding one of the bit line pairs and the first sense amplifier driver and a second sense amplifier section connected to the corresponding one of the bit line pairs and the second sense amplifier driver.

7. The semiconductor memory device according to claim 6, wherein the first sense amplifier section includes two PMOSFETs and the second sense amplifier section includes two NMOSFETs.

8. The semiconductor memory device according to claim 6, wherein the first sense amplifier driver includes a PMOSFET having a first current path connected between the overdrive potential generating circuit and the first sense amplifier section and the second sense amplifier driver includes an NMOSFET having a second current path connected between the second sense amplifier section and the predetermined potential.

9. The semiconductor memory device according to claim 8, wherein the PMOSFET and the NMOSFET are controlled so as to conduct at substantially the same time.

10. The semiconductor memory device according to claim 8, wherein the PMOSFET and the NMOSFET are controlled so as to conduct after the memory cells have been selected.

11. The semiconductor memory device according to claim 1, wherein the first and second sense amplifier drivers start to output the overdrive potential and the predetermined potential, respectively, at substantially the same time and stop outputting after a predetermined time.

12. The semiconductor memory device according to claim 11, wherein the discharge circuit starts an operation of discharging the bit line pairs to a discharge potential after the first and second sense amplifier drivers have stopped outputting the overdrive potential and the predetermined potential, respectively.

13. The semiconductor memory device according to claim 1, wherein the discharge circuit is controlled by a discharge control signal.

14. The semiconductor memory device according to claim 13, further comprising a discharge control signal generating circuit which generates the discharge control signal, and the discharge control signal generating circuit has a function of adjusting the active period of the discharge control signal.

15. The semiconductor memory device according to claim 1, wherein the discharge circuit is provided for each of the bit line pairs and includes a first NMOSFET having a first current path connected between one bit line of a corresponding bit line pair and the discharge potential and a second NMOSFET having a second current path connected between the other bit line of the corresponding bit line pair and the discharge potential.

16. The semiconductor memory device according to claim 15, wherein the first and second NMOSFETs operate during a period when the corresponding bit line pair is discharged to the discharge potential.

17. The semiconductor memory device according to claim 1, wherein the at least one discharge circuit is provided for each of the bit line pairs and includes an NMOSFET having a current path connected between the precharge potential and the discharge potential.

18. The semiconductor memory device according to claim 17, wherein the NMOSFET operates during a period when the corresponding bit line pair is discharged to the discharge potential.

19. The semiconductor memory device according to claim 1, wherein the at least one discharge circuit is provided for every arbitrary number of bit line pairs and includes an NMOSFET having a current path connected between the precharge potential and the discharge potential.

20. The semiconductor memory device according to claim 19, wherein the NMOSFET operates during a period when the bit line pairs is discharged to the discharge potential.

21. The semiconductor memory device according to claim 19, further comprising a switch circuit arranged in the middle of a signal line adapted to supply the precharge potential.

22. The semiconductor memory device according to claim 21, wherein the switch circuit is controlled to be rendered nonconductive during a period when a discharge operation is performed on the precharge potential line by the discharge circuit and rendered conductive during a period when no discharge operation is performed.

23. The semiconductor memory device according to claim 21, wherein the switch circuit includes an NMOSFET.

24. The semiconductor memory device according to claim 1, wherein each of the bit line precharge/equalization circuits comprises a precharge circuit connected to the precharge potential and a corresponding one of the bit line pairs to precharge the corresponding bit line pair to the precharge potential and an equalization circuit connected to the corresponding bit line pair to equalize it.

25. The semiconductor memory device according to claim 24, wherein the precharge circuit comprises a first NMOSFET having a first current path connected between one bit line of the corresponding bit line pair and the precharge signal and a second NMOSFET having a second current path connected between the other bit line of the corresponding bit line pair and the precharge signal.

26. The semiconductor memory device according to claim 24, wherein the equalization circuit comprises an NMOSFET having a current path connected between bit lines of the corresponding bit line pair.

* * * * *